United States Patent [19]

Ishibashi et al.

[11] Patent Number: 5,147,823
[45] Date of Patent: Sep. 15, 1992

[54] METHOD FOR FORMING AN ULTRAFINE METAL PATTERN USING AN ELECTRON BEAM

[75] Inventors: Akira Ishibashi, Kanagawa; Yoshifumi Mori, Chiba; Kenji Funato, Kanagawa, all of Japan

[73] Assignee: Sony Corporation, Tokyo, Japan

[21] Appl. No.: 707,236

[22] Filed: May 22, 1991

Related U.S. Application Data

[63] Continuation of Ser. No. 412,479, Sep. 26, 1989, abandoned.

[30] Foreign Application Priority Data

Sep. 20, 1988 [JP] Japan ............................... 63-245224
Oct. 21, 1988 [JP] Japan ............................... 63-265622

[51] Int. Cl.$^5$ ............... H01L 21/00; H01L 21/02; H01L 21/306
[52] U.S. Cl. .................... 437/225; 437/228; 437/229; 437/928; 437/935; 148/DIG. 46; 430/323; 430/324; 250/492.1; 250/492.3
[58] Field of Search ............ 437/225, 228, 229, 233, 437/928, 935; 148/DIG. 46; 430/5, 323, 324; 250/492.1, 492.2, 492.3

[56] References Cited

U.S. PATENT DOCUMENTS

| | | | |
|---|---|---|---|
| 4,152,478 | 5/1979 | Takagi | 437/235 |
| 4,197,332 | 4/1980 | Broers et al. | 430/272 |
| 4,357,183 | 11/1982 | Fan et al. | 437/139 |
| 4,566,937 | 1/1986 | Pitts | 156/628 |

FOREIGN PATENT DOCUMENTS

| | | |
|---|---|---|
| 0077445 | 4/1983 | European Pat. Off. . |
| 0171068 | 2/1986 | European Pat. Off. . |
| 0318037 | 4/1989 | European Pat. Off. . |
| 3015034 | 10/1981 | Fed. Rep. of Germany . |
| 0046372 | 3/1985 | Japan . |
| 0010241 | 1/1986 | Japan . |
| 0042417 | 2/1987 | Japan . |
| 0152120 | 6/1988 | Japan . |

OTHER PUBLICATIONS

Wolf, S., Silicon Processing for the VLSI Era, vol. 1, pp. 420-421, 1986, Lattice Press.
Gangal, S., Plasma-Poly. Electron Beam Resist Prepar. from Methyl Metacrylate Using Various Carrier Gases, pp. 341-350, Thin Solid Films, 149 (1987).
Morrissey, J., Electron-Beam Contaminantion as a Mask, IBM Tech. Discl. Bull., vol. 20, No. 6, Nov. 1977, p. 2212.
Japanese Patent Abstract, vol. 10, No. 150, (E-408) [2207], May 31, 1986, (11) 61-10241 (A).
IBM Technical Disclosure Bulletin, vol. 20, No. 6 Nov. 1977.

*Primary Examiner*—Brian E. Hearn
*Assistant Examiner*—B. Everhart
*Attorney, Agent, or Firm*—Hill, Van Santen, Steadman & Simpson

[57] ABSTRACT

In a method for forming a pattern, by selectively irradiating a charged particle beam onto a substrate in an atmosphere containing a raw material gas, a resist pattern comprising a material which is produced on the substrate from the raw material gas is formed, wherein a pressure of the raw material gas is set to $10^{-7}$ to $10^{-5}$ Torr, an accelerating voltage of the charged particle beam is set to 0.5 to 6 kV, and a beam current of the charged particle beam is set to $10^{-13}$ to $10^{-7}$ A. Thus, a resist pattern of an ultrafine width can be stably formed in a relatively short time.

Further, in a method for forming a pattern, by irradiating a charged particle beam onto a substrate in an atmosphere containing a gaseous negative type resist, a cross-linking reaction of the negative type resist molecules adsorbed on the surface of the substrate is caused, and a pattern comprising the negative type resist molecules which caused the cross-linking reaction is formed, so that a pattern which has an ultrafine width and can be easily removed by the wet process can be formed.

5 Claims, 5 Drawing Sheets

METHOD FOR FORMING AN ULTRAFINE METAL PATTERN USING AN ELECTRON BEAM

This is a continuation of application Ser. No. 412,479, filed Sep. 26, 1989, abandoned.

BACKGROUND OF THE INVENTION

1. Field of the Invention

The present invention relates to a method for forming a pattern which is suitable for use in formation of a fine pattern in, for instance, the manufacturing of semiconductor devices.

2. Description of the Prior Art

Hitherto, as techniques to form a resist pattern, photolithography using light, and electron beam lithography using electron beams, are used. In the photolithography and electron beam lithography, five steps of coating a resist, baking, exposing, developing, and post baking are necessary; and the wet process is used.

In the conventional photolithography as described above, since the a resolution of which is not longer than the wavelength of the light which is used for exposure cannot be obtained, the minimum pattern width which can be formed is limited to about 0.25 $\mu$m. On the other hand, the use of X-ray lithography using X-rays whose wavelength is short and is about a few Å in place of light has also been known. However, in this case, a large scale apparatus such as a synchrotron orbital radiation (SOR) apparatus is necessary as a light source. In addition, there is a problem that the construction of the optical system such as lens, mask, and the like is generally difficult.

In the conventional electron beam lithography as described above, when an electron beam is irradiated onto an electron beam resist, the trace of the electrons is made random by multiple scattering in the electron beam resist, so that the inherent resolution of the electron beam is lost. Therefore, the width of the pattern which can be formed by the conventional electron beam lithography is at most about 1000 Å. It is extremely difficult to form a pattern of an ultrafine width of about 100 Å.

On the other hand, according to a method for forming a resist by an electron beam which has already been proposed by the same inventors as the present invention, although it is not publicly known (hereinafter, the resist formed by this method is referred to as an EBIR (Electron Beam Induced Resist)), by irradiating an electron beam whose beam diameter was finely converged onto the substrate in the atmosphere containing a raw material gas such as alkylnaphthalene, a resist pattern of an ultrafine width comprising amorphous hydrocarbon can be formed by the dry process. However, it is difficult to remove such a resist pattern comprising amorphous hydrocarbon unless the dry etching such as a reactive ion etching (RIE) is used. However, since there is a fear of occurrence of damages on the substrate and the like upon such a dry etching, a method for forming the resist pattern which can be removed by the wet process is desired.

As methods for forming a pattern, there has been known a method whereby by irradiating an electron beam onto a film to be etched in a carbonaceous gas atmosphere, a carbonaceous mask coating film is formed on the film to be etched (Japanese Patent Laid Open Publication No. Sho 61-0241). Also known is a method whereby a gas containing a deposition material as a component element is supplied onto a substrate which is cooled to 10° C. or less, an electron beam is irradiated to a desired portion of the surface of the substrate, and the material is deposited onto the substrate (Japanese Patent Laid Open Publication No. Sho 62-42417). However, in these literatures publications there is no disclosure concerning the optimum conditions for forming a resist pattern of an ultrafine width.

OBJECTS AND SUMMARY OF THE INVENTION

It is, therefore, an object of the present invention to provide a method for forming a pattern which can form a resist pattern of an ultrafine width on the basis of the dry process.

It is another object of the present invention to provide a method for forming a pattern which can form a resist pattern of an ultrafine width in a relatively short time.

It is a further object of the present invention to provide a method for forming a pattern which can form in stable fashion a resist pattern of an ultrafine width.

It is a still further object of the present invention to provide a method for forming a pattern wherein the pattern can be easily removed by the wet process.

According to one aspect of the present invention, there is provided a method for forming a pattern in which by selectively irradiating a charged particle beam onto a substrate in an atmosphere containing a raw material gas, a resist pattern comprising a material which is produced on the substrate from the raw material gas is formed. A pressure of the raw material gas is set to $10^{-7}$ to $10^{-5}$ Torr, an accelerating voltage of the charged particle beam is set to 0.5 to 6 kV, and a beam current of the charged particle beam is set to $10^{-13}$ to $10^{-7}$ A.

The upper limit of the pressure of the raw material gas is set because when the pressure of the raw material gas is too high, the raw material gas flows into the generating source side of the charged particle beam and the pressure near the generating source of the charged particle beam rises, so that there is a fear of occurrence of a damage of the generating source of the charged particle beam. On the other hand, the lower limit of the pressure of the raw material gas is set in order to assure the resist growth rate of a predetermined value or more; and because when the pressure is set to a low value, there is no meaning in consideration of the ultimate pressure in a specimen chamber before the raw material gas is introduced. On the other hand, the upper limit of the accelerating voltage of the charged particle beam is set because when the accelerating voltage is 6 kV or more, the multiple scattering and backscattering of the charged particles upon irradiation of the charged particle beam becomes remarkable. The lower limit of the accelerating voltage is set because when the accelerating voltage is 0.5 kV or less, it is difficult to control the charged particle beam. On the other hand, the upper limit of the beam; current of the charged particle beam is set in consideration of a performance of the generating source of the charged particle beam and its lower limit is set in order to assure the resist growth rate of a predetermined value or more.

As a charged particle beam; an electron beam, a positron beam, a muon beam, or the like can be used. In the case of using the electron beam, it is preferable to use a field emission gun which can generate an electron beam having good coherence.

Since the beam diameter of the charged particle beam can be set to an extremely small value, a pattern of an ultrafine width can be formed. In this case, since the pressure of the raw material gas is $10^{-7}$ Torr or more and the beam current of the charged particle beam is $10^{-13}$ A or more, a resist growth rate of a predetermined value or more can be obtained. Therefore, the resist pattern can be formed in a relatively short time. In addition, since the pressure of the raw material gas is $10^{-5}$ Torr or less and the accelerating voltage of the charged particle beam is 0.5 kV or more, the instability of the charged particle beam and the occurrence of damage of the generating source due to the high pressure near the generating source of the charged particle beam are eliminated and the controllability of the charged particle beam is also good. Therefore, since the charged particle beam can be stably irradiated, the resist pattern can be formed in stable fashion.

According to another aspect of the present invention there is provided a method for forming a pattern in which by selectively irradiating a charged particle beam onto a substrate in an atmosphere containing a gaseous negative type resist, a cross-linking reaction of negative type resist molecules adsorbed on the surface of the substrate is caused, thereby forming a pattern comprising the negative type resist molecules which caused the cross-linking reaction.

As a negative type resist, it is possible to use a negative type resist for the electron beam such as epoxidated polybutadiene (EPB), poly (glycidyl methacrylate) (PGMA), poly (glycidyl methacrylate-ethylacrylate copolymer) (P(GMA-EA)), material (CER) in which methacrylic acid was reacted to ternary polymer of MMA, GMA, and EA, chloro methylated polystyrene (CMS), poly (glycidyl methacrylate-styrene copolymer) (P(GMA-St)), poly (glycidyl methacrylate-3-chlorostyrene copolymer) (P(GMA-3Cl St)), methyl-maleic acid additive (SEL-N) of PGMA, polyethyl vinyl ether (CEVE), vinyl ether copolymer (CVE), polysiloxane (PSi), poly 4-chlorostyrene (P4Cl St), polyvinyl benzyl chloride (PVBCl), iodinated polystyrene (I-PS), chloromethylated poly-α-methylstyrene (αM-CMS), polystyrene tetrathiafulbalene (PS-TTF), etc. Among those negative type resists, CMS, P(GMA-St), P(GMA-3Cl St), PSi, P4Cl St, PVBCl, I-PS, αM-CMS, and PS-TTF are excellent in terms of the withstanding property against the dry etching. Sensitivities ($\mu C/cm^2$) of those negative type resists will now be shown in parentheses after the resist names hereinafter EPB (0.05), PGMA (0.1), P(GMA-EA) (0.34), CER (0.3), CMS (0.4–1.2), P(GMA-St) (2.6), P(GMA-3Cl St) (2.8), SEL-N (0.3), CEVE (2), CVE (0.25), PSi (1), P4Cl St (2.5), PVBCl (0.46), I-PS (1.5), αM-CMS (8.2), and PS-TTF (6).

In the atmosphere containing the gaseous negative type resist, the molecules of the negative type resist are adsorbed on the surface of the substrate. When the charged particle beam is irradiated onto the substrate on which the negative type resist molecules are adsorbed, the adsorbed negative type resist molecules cause the cross-linking reaction. Thus, the pattern comprising the negative type resist molecules which caused the cross-linking reaction is formed on the substrate. A width of the pattern is determined by the beam diameter of the charged particle beam and the size of blur in the irradiation region due to the backscattering of the charged particles from the substrate. The problem of the resolution deteriorating due to the multiple scattering of the electrons in the electron beam resist as in the conventional technique does not occur. Therefore, a pattern of an ultrafine width of about 100 Å can be easily formed. On the other hand, the pattern comprising the negative type resist molecules which caused the cross-linking reaction can be easily removed by the wet process using a solvent of the negative type resist.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

An embodiment of the present invention will be described hereinbelow with reference to the drawings. The embodiment shows an embodiment in the case where the invention is applied to a method for forming a pattern using direct writing by an electron beam.

Figure 1:
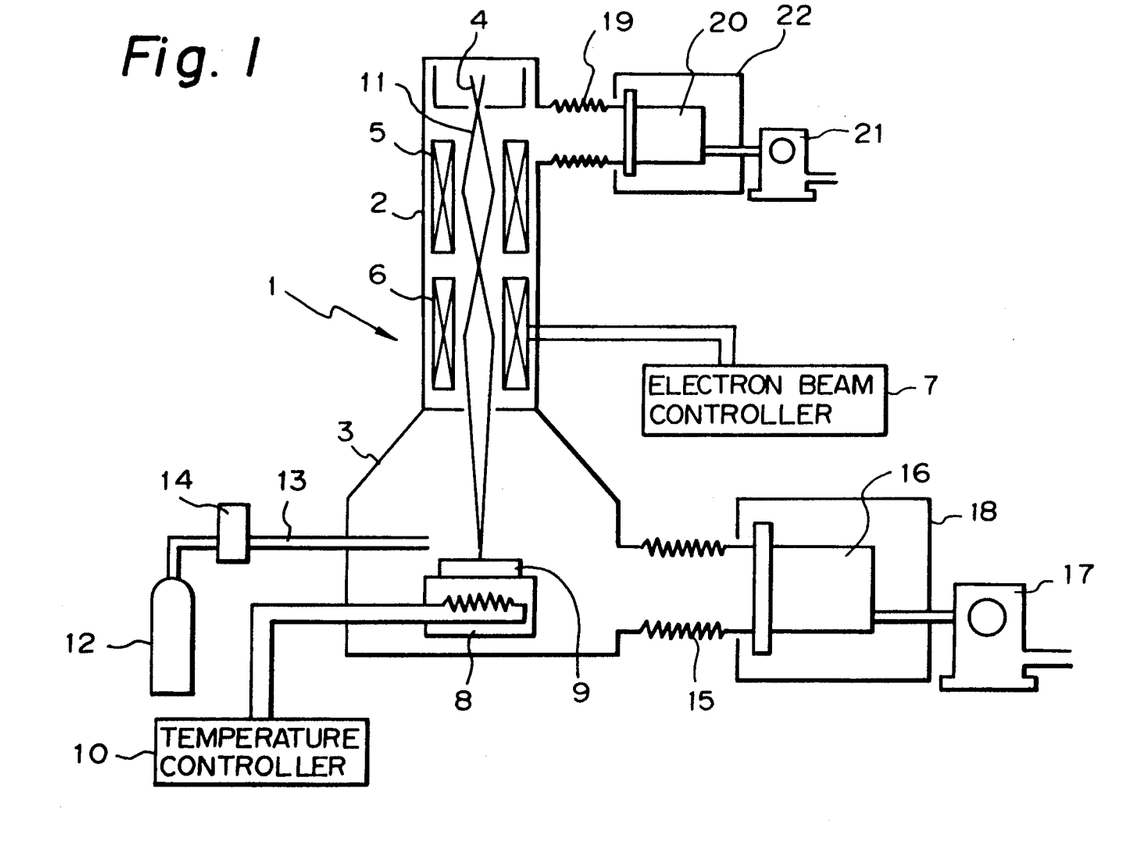
FIG. 1 is a cross sectional view showing a pattern forming apparatus which is used in an embodiment of the present invention.

FIG. 1 shows a pattern forming apparatus which is used in an embodiment of the present invention.

As shown in FIG. 1, the pattern forming apparatus has a direct writing apparatus 1 using an electron beam having a construction similar to a scanning electron microscope (SEM). The direct writing apparatus 1 has a barrel 2 and a specimen chamber 3. A field emission gun 4 which can generate an electron beam having a good coherence, a condenser lens 5, and a deflecting lens 6 are provided in the barrel 2. The deflecting lens 6 is controlled by an electron beam controller 7.

On the other hand, a susceptor 8 is provided in the specimen chamber 3 and a substrate 9 is arranged on the susceptor 8. For instance, the susceptor 8 is constructed such that it can be heated or cooled by a temperature controller 10 comprising a resistance heater and a Peltier cooler (cooler using the Peltier effect), so that the temperature of the substrate 9 can be set to a predetermined temperature. An electron beam 11 which is generated from the field emission gun 4 is converged by the condenser lens 5. Thereafter, the converged electron beam 11 is deflected by the deflecting lens 6 controlled by the electron beam controller 7, thereby scanning on the substrate 9 arranged on the susceptor 8.

Reference numeral 12 denotes a vessel in which a resist raw material is enclosed. The resist raw material in the vessel 12 can be introduced into the specimen chamber 3 through a conduit 13. For instance, alkylnaphthalene can be used as a resist raw material. Reference numeral 14 denotes a mass flow controller to adjust a flow rate of the resist raw material. Although alkylnaphthalene exists in a liquid form at ordinary temperature, it can be easily gasified in the specimen chamber 3 held in the vacuum.

In the embodiment, the vacuum evacuation of the specimen chamber 3 is executed by a turbo molecular pump 16 coupled with the specimen chamber 3 through a flexible tube 15 having a large diameter and an sufficiently high conductance. A rotary pump 17 is connected to the exhaust side of the turbo molecular pump 16. The turbo molecular pump 16 is enclosed by a shield 18 to shield the magnetic field which is generated from a motor to drive the turbo molecular pump 16. For instance, a magnetic material such as permalloy is used for the material of the shield 18. In a manner similar to the above, the vacuum evacuation of the barrel 2 is executed by a turbo molecular pump 20 coupled with the upper portion of the barrel 2 through a flexible tube 19. Reference numeral 21 denotes a rotary pump connected to the exhaust side of the turbo molecular pump 20. Reference numeral 22 denotes a shield to shield the magnetic field which is generated from a motor to drive the turbo molecular pump 20. The shield 22 is made of a magnetic material such as permalloy similar to the shield 18.

In the embodiment, the vibration of the direct writing apparatus 1 in which the turbo molecular pump 16 is a vibrating source is the largest cause of deterioration of the accuracy of writing by the electron beam 11. Therefore, to prevent it, a spring constant k of the flexible tube 15 is selected so as to satisfy the following equation.

$$k \lesssim \frac{dm\omega^2}{A} \quad (1)$$

where d is a beam diameter of the electron beam 11, m is a mass of the direct writing apparatus 1, $\omega$ is an angular frequency of the vibration of the turbo molecular pump 1, and A is an amplitude of the vibration of the turbo molecular pump 16. By selecting the spring constant k of the flexible tube 15 so as to satisfy the equation (1), the vibration of the direct writing apparatus 16 which is caused by the vibration of the turbo molecular pump 16 can be remarkably reduced. The reasons will now be described hereinbelow.

The equation of the forced vibration of the direct writing apparatus 1 in which the turbo molecular pump 16 is a vibrating source is $$m\ddot{x} = -k(x - Ae^{i\omega t}) \quad (2)$$

where x denotes a displacement of the direct writing apparatus 1 in the horizontal direction from the equilibrium position and t denotes time. Assuming that $x = Be^{i\omega t}$ (B is an amplitude of the vibration of the direct writing apparatus 1), in the equation (2), $$-mB\omega^2 e^{i\omega t} = -k(Be^{i\omega t} - Ae^{i\omega t}) \quad (3)$$

By rearranging the equation (3), $$mB\omega^2 - kB = -kA \quad (4)$$

is obtained. Thus, $$\frac{B}{A} = \frac{K}{k - m\omega^2} \quad (5)$$

The condition to execute the writing by the electron beam 11 at the dimensional accuracy which is equal to or less than the beam diameter d is $B \leq d$. In this case, from the equation (5), $$\frac{1}{|1 - (m/k)\omega^2|} = \frac{B}{A} \lesssim \frac{d}{A} \quad (6)$$

Now, when it is assumed that $(m/k)\omega^2 > 1$ and 1 is ignored for $(m/k)\omega^2$, the condition of the equation (6) is as follows:

$$\frac{k}{m\omega^2} \lesssim \frac{d}{A} \quad (7)$$

By modifying the equation (7), the equation (1) is derived.

A practical example of the calculations of the spring constant k will now be shown below. The amplitude of the vibration upon operation of the turbo molecular pump 16, that is, A in the equation (1) can be regarded to be 1 $\mu$m = $10^{-6}$ m or less. On the other hand, assuming that the rotational speed of the turbo molecular pump 16 is, for instance, 40000 r.p.m., $\omega = 2\pi \times (40000/60) \sim 4 \times 10^3$ rad/sec. The mass m of the direct writing apparatus 1 is set to, for instance, about 100 kg. On the other hand, d = 10 Å = $10^{-9}$ m by considering the case where electron beam 11 was converged to the smallest diameter. By substituting those numerical values for the equation (1), $$k \lesssim \frac{10^{-9} \times 100 \times (4 \times 10^3)^2}{10^{-6}} = 1.6 \times 10^6 \text{ N/m}$$

A method for forming a resist pattern according to the embodiment will now be described.

Figure 2A:
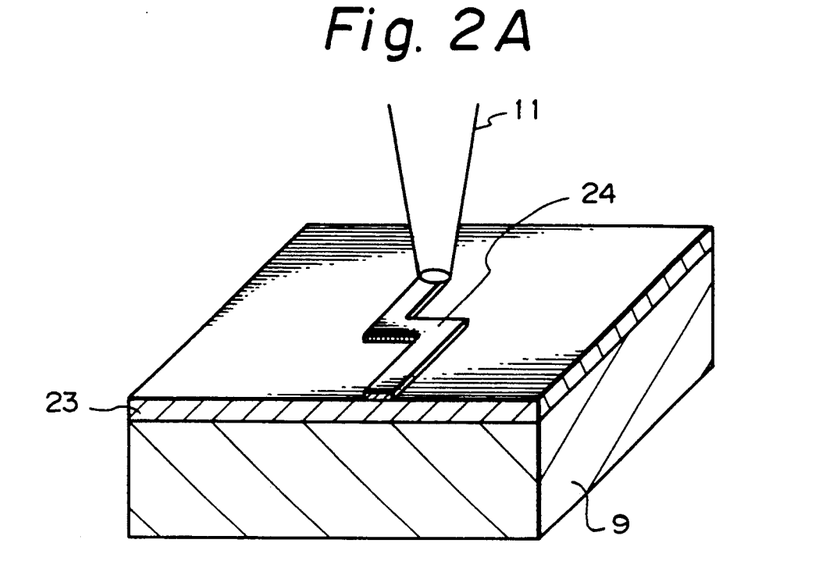
FIGS. 2A to 2D show perspective views for explaining a method for forming a pattern according to an embodiment of the present invention in accordance with a step sequence.

In FIG. 1, the specimen chamber 3 is previously evacuated to a high vacuum (for instance, about $3 \times 10^{-7}$ Torr) by the turbo molecular pump 16. In this state, the resist raw material in the vessel 12 is introduced into the specimen chamber 3 through the conduit 13 while controlling the flow rate by the mass flow controller 14. The pressure of the resist raw material gas in the specimen chamber 3 is set to a value within a range from $10^{-7}$ to $10^{-5}$ Torr, for instance about $10^{-6}$ Torr. The substrate 9 such as a gallium arsenide (GaAs) substrate has previously been arranged on the susceptor 8 in the specimen chamber 3 and is held at a predetermined temperature by the temperature controller 10. As shown in FIG. 2A, in this case it is assumed that a metal film 23 such as a tungsten (W) film has been formed on the substrate 9.

After the pressure of the resist raw material gas in the specimen chamber 3 reached a predetermined value, the electron beam 11 is generated by the field emission gun 4. The electron beam 11 is scanned on the metal film 23 in the resist raw material gas atmosphere under control by the electron beam controller 7, thereby writing a predetermined pattern. In this case, the accelerating voltage of the electron beam 11 is set to a value within a range from 0.5 to 6 kV. The beam current is set to a value within a range from $10^{-13}$ to $10^{-7}$ A. Furthermore, the beam diameter of the electron beam 11 is set to, for instance, about 100 Å.

Figure 2B:
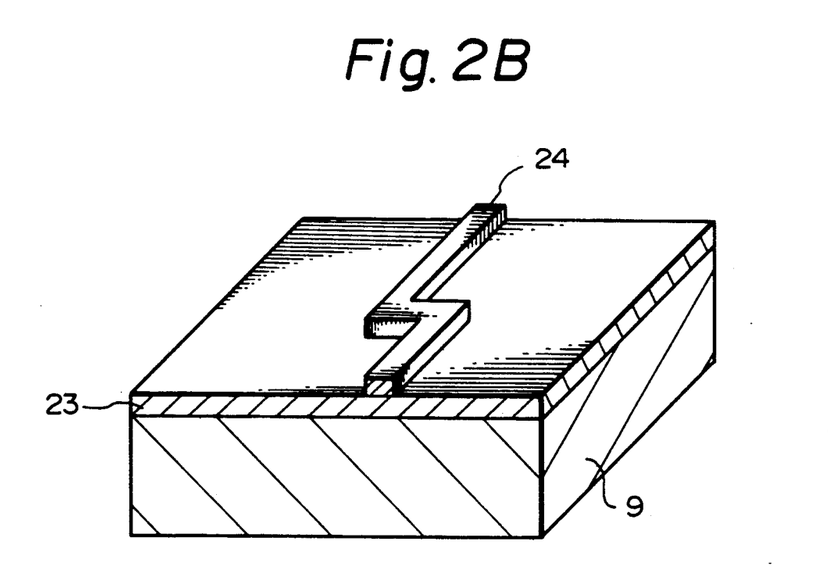

In the above resist raw material gas atmosphere, the resist raw material gas molecules are adsorbed onto the surface of the metal film 23. When the electron beam 11 is irradiated onto the resist raw material molecules which are adsorbed, the resist molecules in the portion to which the electron beam 11 was irradiated are transformed to amorphous hydrocarbon. Thus, the material comprising amorphous hydrocarbon is produced on the metal film 23 in the same shape as the writing pattern of the electron beam 11. Due to this, a resist pattern 24 comprising amorphous hydrocarbon is formed. The resist pattern 24 comprising amorphous hydrocarbon has an excellent withstanding property against the dry etching. Since a thickness of the resist pattern 24 which is formed by the single writing operation by the electron beam 11 is ordinarily small, the process to produce hydrocarbon by irradiating the electron beam 11 into the resist raw material molecules which are adsorbed onto the resist pattern 24 which has once been formed is repeated. The resist pattern 24 having a predetermined thickness is thus formed. FIG. 2B shows such a state. In this case, on the metal film 23 of the portion to which the electron beam 11 is not irradiated, when the resist raw material molecules adsorbed are formed as a few atomic layers, the adsorption of the resist raw material molecules is saturated and the adsorption does not occur any more. Therefore, the growth of the resist in the portion to which the electron beam 11 is not irradiated can be ignored.

Figure 2C:
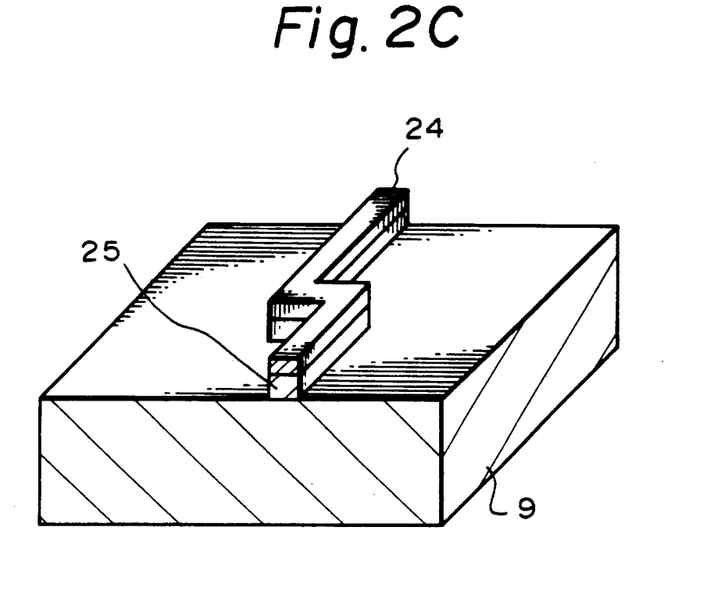
Figure 2D:
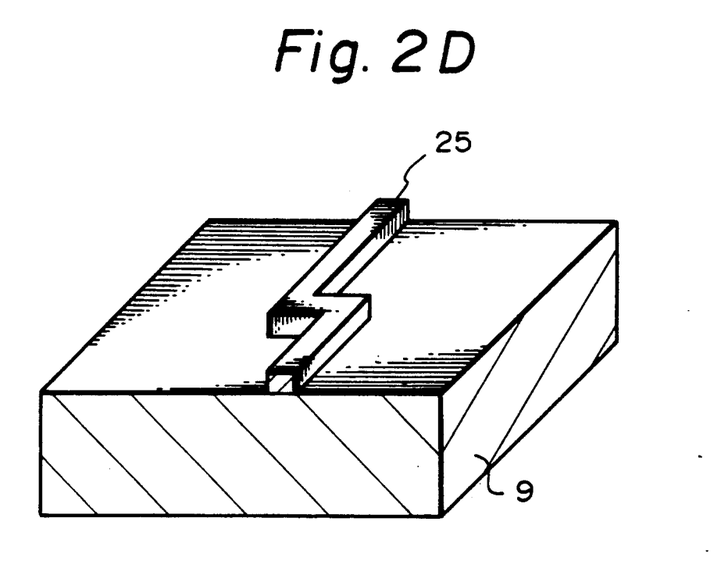

After the resist pattern 24 of a predetermined thickness is formed as shown in FIG. 2B, the metal film 23 is anisotropically etched in the direction perpendicular to the substrate surface by, for instance, the RIE using the resist pattern 24 as a mask. Thus, as shown in FIG. 2C, a metal ultrafine line 25 having the same shape as the resist pattern 24 and whose width is, for instance, about 100Å is formed. Thereafter, the resist pattern 24 is etched off and a state as shown in FIG. 2D is obtained.

The metal ultrafine line 25 can be used as a Schottky gate electrode of a Schottky gate FET such as a GaAs MESFET or an HEMT (High Electron Mobility Transistor), a wiring, or the like. If the metal ultrafine line 25 is used as a Schottky gate electrode, an FET whose transconductance gm is extremely high and which can operate at a superhigh speed can be realized.

As mentioned above, according to the embodiment, the writing by the electron beam 11 is executed under the conditions that the pressure of the resist raw material gas is $10^{-7}$ to $10^{-5}$ Torr, the accelerating voltage of the electron beam 11 is 0.5 to 6 kV, and the beam current is $10^{-13}$ to $10^{-7}$ A. Therefore, the occurrence of damage of the field emission gun 4 and the instability of the electron beam 11 do not occur and the growth rate of the resist is also relatively high. Consequently, the resist pattern 24 of an ultrafine width can be formed in stable fashion in a relatively short time.

On the other hand, since the spring constant k of the flexible tube 15 connecting the direct writing apparatus 1 and the turbo molecular pump 16 is selected so as to satisfy the equation (1), the vibration of the direct writing apparatus 1 which is caused by the vibration due to the operation of the turbo molecular pump 16 greatly decreases. Therefore, the oscillation of the electron beam 11 is greatly reduced, so that the direct writing by the electron beam 11 can be executed at high accuracy. On the other hand, since the resist pattern 24 can be formed by the single step of direct writing by the electron beam 11, the steps which are necessary to form the resist pattern 24 can be remarkably reduced as compared with that in the conventional apparatus.

Further, in the embodiment, since the writing is performed by using the electron beam 11 of good coherence which is generated from the field emission gun 4, the resist pattern 24 can be formed at a resolution of about tens of Å. Thus, the metal ultrafine line 25 can be formed as mentioned above. More generally speaking, for instance, an ultrafine structure of smaller dimensions than the De Broglie wavelength (about hundreds of Å) of the electrons in the semiconductor can be formed. Therefore, a device using the quantum effect or the like can be realized.

On the other hand, since the vacuum evacuation of the specimen chamber 3 is executed by the oil-free turbo molecular pump 16, the resist pattern 24 can be formed in a clean vacuum where no oil molecules exist.

Another embodiment of the present invention will now be described.

FIGS. 3A to 3D show another embodiment of the present invention in accordance with the step sequence.

Figure 3A:
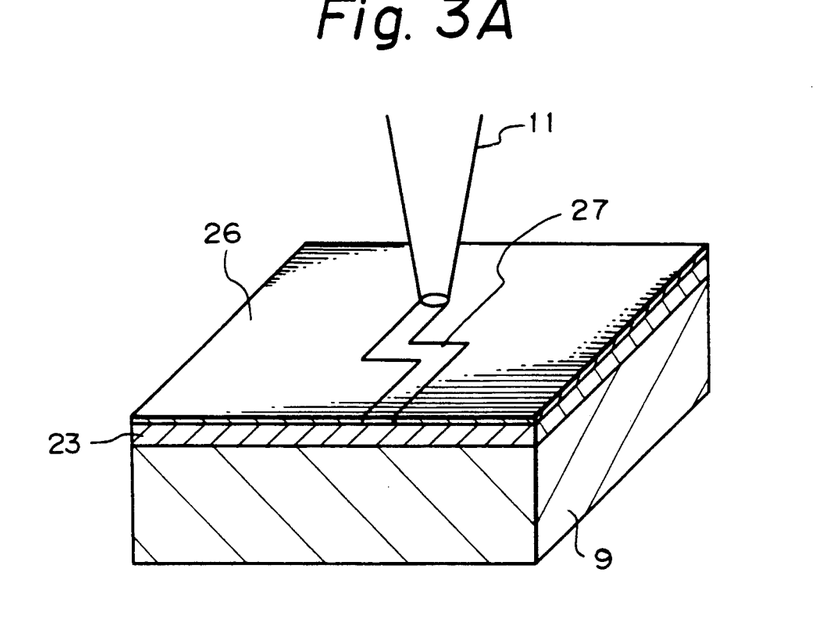
FIGS. 3A to 3D are perspective views showing another embodiment of the present invention in accordance with a step sequence.

In the embodiment, as shown in FIG. 3A, first there is prepared a substrate 9 such as a GaAs substrate on which a metal film 23 such as a W film is formed. Then, a gaseous negative type resist for an electron beam is introduced into the specimen chamber 3 of the pattern forming apparatus shown in FIG. 1. A vapor pressure of the negative type resist is preferably set to, for instance, about $10^{-6}$ Torr. Although the negative type resist for the electron beam exists as a liquid form in the atmosphere, it is easily gasified in the vacuum. In the gaseous negative type resist atmosphere, a negative type resist molecular layer 26 comprising negative type resist molecules adsorbed on the surface of the metal film 23 is formed. Next, in the specimen chamber 3, an electron beam 11 whose beam diameter was finely converged to, for instance, about 100 Å is irradiated onto the metal film 23 in the gaseous negative type resist atmosphere while scanning with a predetermined pattern. An accelerating voltage of the electron beam 11 is set to, for example, about 6 kV. On the other hand, a beam current of the electron beam 11 is selected so as to obtain an irradiation charge density which is substantially equivalent to, for instance, the sensitivity of the negative type resist which is used.

The molecules in the negative type resist molecular layer 26 of the portion to which the electron beam 11 was irradiated causes the cross-linking reaction. Reference numeral 27 indicates a portion comprising the negative type resist molecules which caused the cross-linking reaction. Since a thickness of the negative type resist molecular layer which caused the cross-linking reaction, and which can be formed by one scan of the electron beam 11, is small, the foregoing scan of the electron beam 11 is repetitively executed until the thickness of the portion 27 comprising the negative type resist molecules which caused the bridge reaction reaches a desired thickness. Practically speaking, in a case of irradiating the electron beam 11 at the charge density of, for instance, about 0.1 pC/cm, the scan of the electron beam 11 is repeated about $10^4$ to $10^5$ times.

Figure 3B:
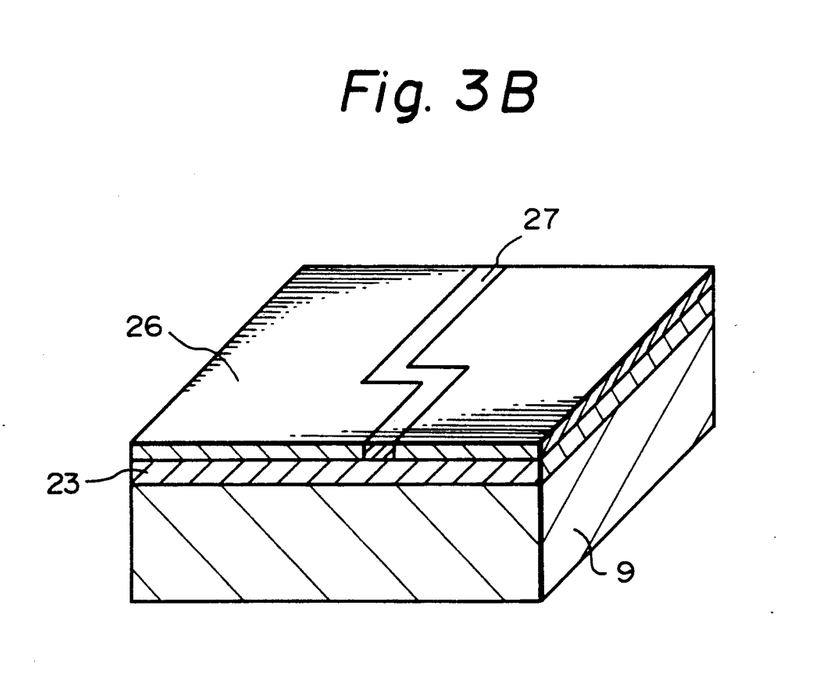

FIG. 3B shows a state in which the portion 27, comprising the negative type resist molecules which caused the bridge reaction has been formed to a desired thickness by repetitively executing the scan of the electron beam 11 as mentioned above.

Figure 3C:
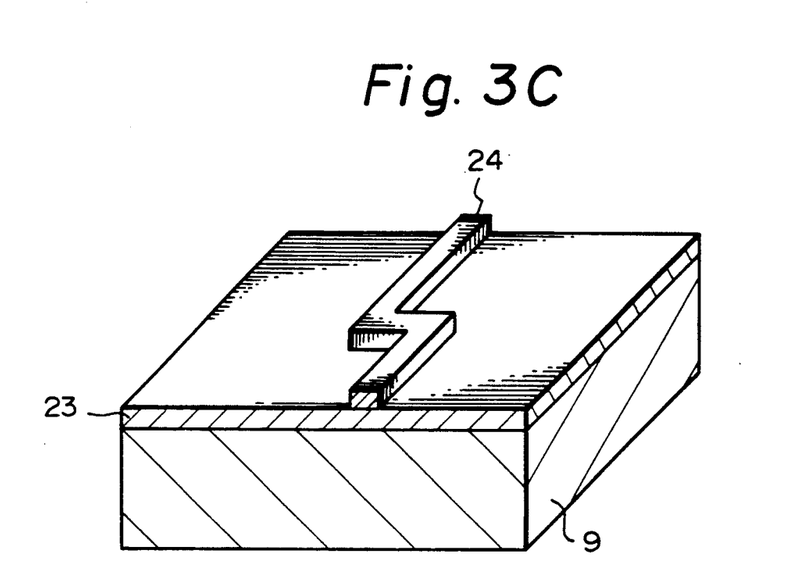

Then the negative type resist molecular layer 26 to which the electron beam 11 is not irradiated therefore the portions of the layer 26 which does not cause the bridge reaction is selectively removed by the wet process using the solvent for the negative type resist. Thus, as shown in FIG. 3C, a resist pattern 24 comprising the negative type resist molecules which caused the bridge reaction is formed. A width of the resist pattern 24 is substantially equal to the beam diameter of the electron beam 11 and, practically speaking, it is set to, for instance, about 100 Å.

Figure 3D:
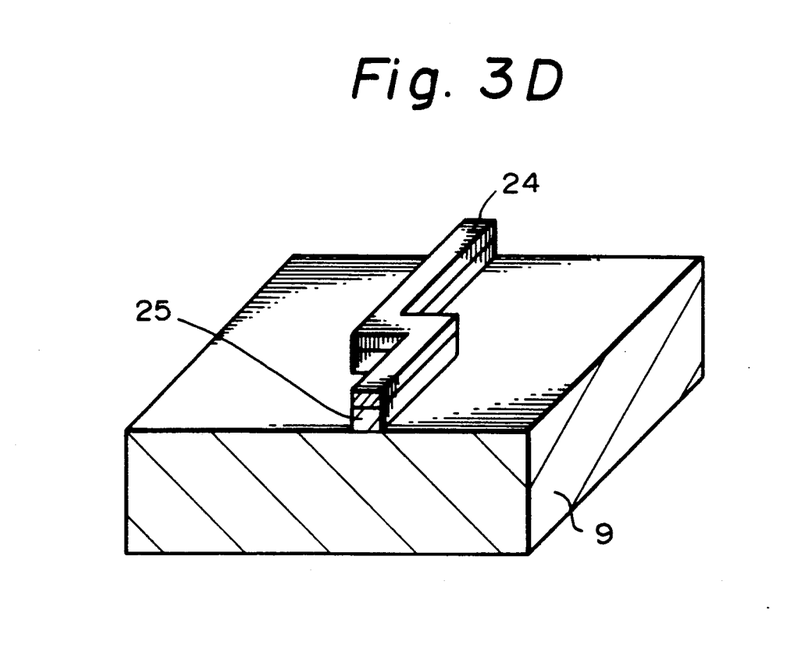

Next, the metal film 23 is anisotropically etched in the direction perpendicular to the substrate surface by, for instance, the RIE by using the resist pattern 24 as a mask. Thus, as shown in FIG. 3D, a metal ultrafine line 25 of a width of, for instance, about 100 Å is formed. Thereafter, the resist pattern 24 is removed by the wet process using the solvent.

Under the irradiating conditions of the electron beam 11 mentioned above, the EBIR comprising amorphous hydrocarbon which has already been mentioned is not formed. This is because of the typical conditions which are used to form the EBIR, that is that the beam current of the electron beam 11 is set to $10^{-11}$ A, the irradiating time is set to 10 seconds, the irradiation length is set to 100 ($\mu$m), the irradiation width is set to 1000 (Å), and the irradiation charge density is set to $$\frac{10^{-11} (A) \times 10 (\text{sec})}{100 (\mu m) \times 1000 (A)} = \frac{10^{-11} \times 10 (C)}{10^{-2} (\text{cm}) \times 10^{-5} (\text{cm})}$$
$$= 10^{-3} \text{ C/cm}^2$$
$$= 1000 \ \mu\text{C/cm}^2$$

This is larger by about three to four orders of magnitude than the sensitivity of the negative type resist for the electron beam which has already been mentioned.

As mentioned above, according to the embodiment, since the electron beam 11 is irradiated onto the metal film 23 in the gaseous negative type resist atmosphere, the resist pattern 24 of the ultrafine width which is substantially determined by the beam diameter of the electron beam 11 can be formed. By etching the metal film 23 by using the resist pattern 24 as a mask, the metal ultrafine line 25 can be formed. On the other hand, since the resist pattern 24 can be easily removed by the solvent in the wet process, there is no fear of occurrence of damage on the substrate 9 and the like upon removal of the resist pattern 24. Further, the so-called lift-off process can also be realized.

Although the embodiments of the invention have been described above, the invention is not limited to the above embodiments, and various types of modifications ar possible on the basis of the technical idea of the invention.

For instance, the invention can be also obviously applied to form a gate electrode of an MISFET, and can be also applied to the case where, for example, a semiconductor substrate is etched so as to obtain an ultrafine width, thereby realizing a quasi one-dimensional FET. Further, the invention can be applied to the case of forming an ultrafine pattern onto an arbitrary substrate other than the semiconductor substrate.

Also, in the pattern forming apparatus shown in FIG. 1, a diffusion pump can be also connected to the exhaust sides of the turbo molecular pumps 16 and 20. On the other hand, the vacuum evacuation of the barrel 2 can be also executed by, for example, an ion pump.

According to the present invention, a resist pattern of an ultrafine width can be stably formed in a relatively short time. Further, according to the present invention, it is possible to form a pattern of an ultrafine width which can be easily removed by the wet process.

What is claimed is:

1. A method for forming an ultrafine metal pattern, comprising the steps of:
    providing a substrate on which a metal film is formed, said substrate and metal film being provided in a vacuum specimen chamber;
    introducing a gaseous negative type resist for an electron beam into the specimen chamber, a vapor pressure of the negative type resist being in a range from $10^{-7}$ to $10^{-5}$ Torr;
    providing a vacuum in said specimen chamber, and forming a negative type resist molecular layer comprising negative type resist molecules absorbed on a surface of the metal film;
    irradiation an electron beam whose beam diameter is finely converged to approximately 100 Å or less onto the metal film in the gaseous negative type resist atmosphere while scanning a desired pattern, an accelerating voltage of the electron beam being in a range from 0.5 to approximately 6 kV, and having a beam current in a range from $10^{-13}$ to $10^{-7}$ A;
    molecules in said negative type resist molecular layer where said electron beam is irradiated causing a cross linking reaction;
    repetitively executing scanning of the electron beam for said desired pattern until a thickness of the desired pattern which was initially irradiated and comprising the negative type resist molecules which caused the cross linking reaction reaches a desired thickness;
    selectively removing portions of the negative type resist molecular layer to which the electron beam was not irradiated by a wet process using a solvent for the negative type resist, a resist pattern remaining which comprises the negative type resist molecules which caused the cross linking reaction, and a width of said resist pattern being substantially equal to said beam diameter of the electron beam;
    aniostropically etching the metal film while suing the resist pattern as a mask so as to form a metal ultrafine line of 100 Å or less; and
    removing the resist pattern by a wet process using a solvent.

2. A method according to claim 1 wherein the metal layer is tungsten.

3. A method according to claim 1 wherein the vapor pressure of the negative type resist is approximately $10^{-6}$ Torr.

4. A method according to claim 1 wherein the accelerating voltage of the electron beam is approximately 6 kV.

5. A method according to claim 1 wherein the beam current of the electron beam is selected so as to obtain an irradiation charge density which is substantially equivalent to a sensitivity of the negative type resist which is used.

* * * * *